(12) United States Patent
Bindschedler et al.

(10) Patent No.: US 9,130,089 B2
(45) Date of Patent: Sep. 8, 2015

(54) DEVICE FOR SUPPORTING AND ATTACHING PANELS OR THE LIKE, AND ROOF SYSTEM COMPRISING SUCH A DEVICE

(75) Inventors: Pierre Etienne Bindschedler, Obernai (FR); Damien Fulcrand, Strasbourg (FR); Rémi Perrin, Boersch (FR); Henri Desgouilles, Paris (FR)

(73) Assignee: SOPREMA (SOCIETE PAR ACTIONS SIMPLIFIEE), Strasbourg (FR)

( * ) Notice: Subject to any disclaimer, the term of this patent is extended or adjusted under 35 U.S.C. 154(b) by 0 days.

(21) Appl. No.: 13/809,248

(22) PCT Filed: Jul. 7, 2011

(86) PCT No.: PCT/FR2011/051626
§ 371 (c)(1),
(2), (4) Date: Feb. 11, 2013

(87) PCT Pub. No.: WO2012/004542
PCT Pub. Date: Jan. 12, 2012

(65) Prior Publication Data
US 2013/0133275 A1        May 30, 2013

(30) Foreign Application Priority Data

Jul. 9, 2010   (FR) .................................... 10 55631

(51) Int. Cl.
*H01L 31/042*    (2014.01)
*F24J 2/52*      (2006.01)
*H02S 20/23*     (2014.01)

(52) U.S. Cl.
CPC .......... *H01L 31/0422* (2013.01); *F24J 2/5203* (2013.01); *F24J 2/5237* (2013.01);

(Continued)

(58) Field of Classification Search
CPC ..... H01L 31/0422; H02S 20/00; H02S 20/23; F24J 2/5203; F24J 2/5237; F24J 2/5245; F24J 2002/5294; Y02E 10/47; Y02E 10/50; Y02E 10/40; Y02E 10/52; Y02E 10/12; Y02E 10/20
USPC ................. 52/173.3, 506.03, 506.06, 800.11; 136/251, 259; 126/621, 622, 623
See application file for complete search history.

(56) References Cited

U.S. PATENT DOCUMENTS 4,419,531 A * 12/1983 Lang et al. ..................... 136/251
4,674,244 A *  6/1987 Francovitch ................. 52/173.3
(Continued)

FOREIGN PATENT DOCUMENTS

DE    10 2007 019596    10/2007
DE    20 2009 002040     8/2009
(Continued)

OTHER PUBLICATIONS

International Search Report dated Jun. 4, 2012, corresponding to PCT/FR2011/051626.

*Primary Examiner* — James Ference
(74) *Attorney, Agent, or Firm* — Young & Thompson

(57) ABSTRACT

A device for supporting and attaching panels to a roof including an added sealing covering on the surface thereof includes brackets for tiltedly supporting and bearing the panels, including a bottom bearing portion and at least one top portion for supporting the panels, the brackets having a triangular structure and consisting of a hollow body. The device is characterized in that the bottom portion (4) of the brackets (3) is provided, on the underside thereof, with at least one added plate (5) secured to the console (3), wherein the plate(s) (5) consist of a material or contain a material that is compatible with and/or similar to the layer or the surface coating of the roof covering (2), and are bonded to the layer or the covering by an adhesive bond, and in that the top portion (4') provides bearing surfaces for the edges of the panels or profile members for mounting such panels.

15 Claims, 13 Drawing Sheets

(52) U.S. Cl.
CPC .............. *F24J 2/5245* (2013.01); *H02S 20/00* (2013.01); *H02S 20/23* (2014.12); *F24J 2002/5294* (2013.01); *Y02B 10/12* (2013.01); *Y02B 10/20* (2013.01); *Y02E 10/47* (2013.01)

(56) References Cited

U.S. PATENT DOCUMENTS

| | | | |
|---|---|---|---|
| 6,105,316 A * | 8/2000 | Bottger et al. | 52/173.3 |
| 6,740,356 B2 * | 5/2004 | Bindschedler et al. | 427/210 |
| 6,968,654 B2 * | 11/2005 | Moulder et al. | 52/173.3 |
| 7,260,918 B2 * | 8/2007 | Liebendorfer | 52/173.3 |
| 7,849,849 B2 * | 12/2010 | Genschorek | 126/704 |
| 7,906,204 B2 * | 3/2011 | Bindschedler et al. | 428/292.1 |
| 2006/0174931 A1 * | 8/2006 | Mapes et al. | 136/251 |
| 2006/0196128 A1 * | 9/2006 | Duke | 52/173.3 |
| 2007/0144575 A1 * | 6/2007 | Mascolo et al. | 136/246 |
| 2007/0157963 A1 * | 7/2007 | Metten et al. | 136/251 |
| 2008/0087275 A1 * | 4/2008 | Sade et al. | 126/623 |
| 2008/0236058 A1 * | 10/2008 | Antonie | 52/90.1 |
| 2009/0019796 A1 * | 1/2009 | Liebendorfer | 52/173.3 |
| 2009/0242014 A1 * | 10/2009 | Leary | 136/251 |
| 2009/0266406 A1 * | 10/2009 | Duke et al. | 136/251 |
| 2009/0320898 A1 * | 12/2009 | Gumm | 136/245 |
| 2009/0320906 A1 * | 12/2009 | Botkin et al. | 136/251 |
| 2010/0077679 A1 * | 4/2010 | Sagayama | 52/173.3 |
| 2010/0089390 A1 * | 4/2010 | Miros et al. | 126/608 |
| 2010/0219304 A1 * | 9/2010 | Miros et al. | 248/125.8 |
| 2010/0236155 A1 * | 9/2010 | Lanza | 52/58 |
| 2010/0307074 A1 * | 12/2010 | Stearns et al. | 52/173.1 |
| 2011/0023390 A1 * | 2/2011 | Kneip et al. | 52/173.3 |
| 2011/0083381 A1 * | 4/2011 | David et al. | 52/173.3 |
| 2011/0108083 A1 * | 5/2011 | Ravestein et al. | 136/244 |
| 2011/0138602 A1 * | 6/2011 | Stanley | 29/428 |
| 2011/0197944 A1 * | 8/2011 | Hund et al. | 136/244 |
| 2011/0247279 A1 * | 10/2011 | Stearns et al. | 52/58 |
| 2012/0085041 A1 * | 4/2012 | Place | 52/173.3 |

FOREIGN PATENT DOCUMENTS

| | | |
|---|---|---|
| DE | 20 2009 005202 | 11/2009 |
| FR | 2 494 408 | 5/1982 |
| FR | 2 890 725 | 3/2007 |
| WO | 2009/077030 | 6/2009 |

* cited by examiner

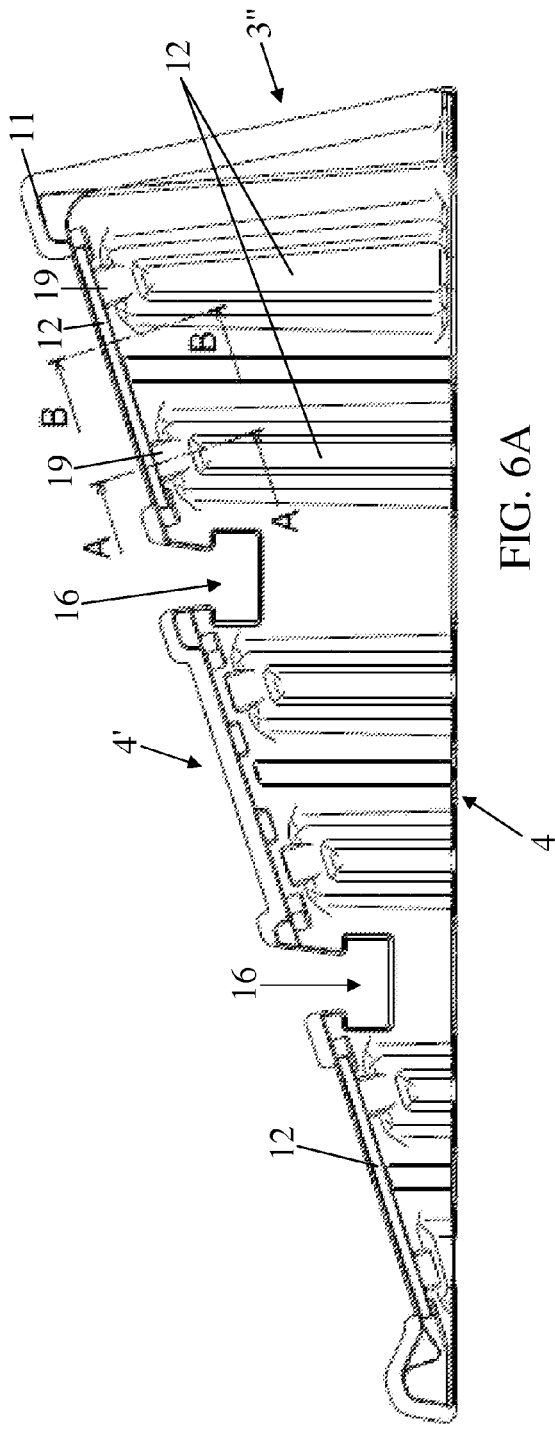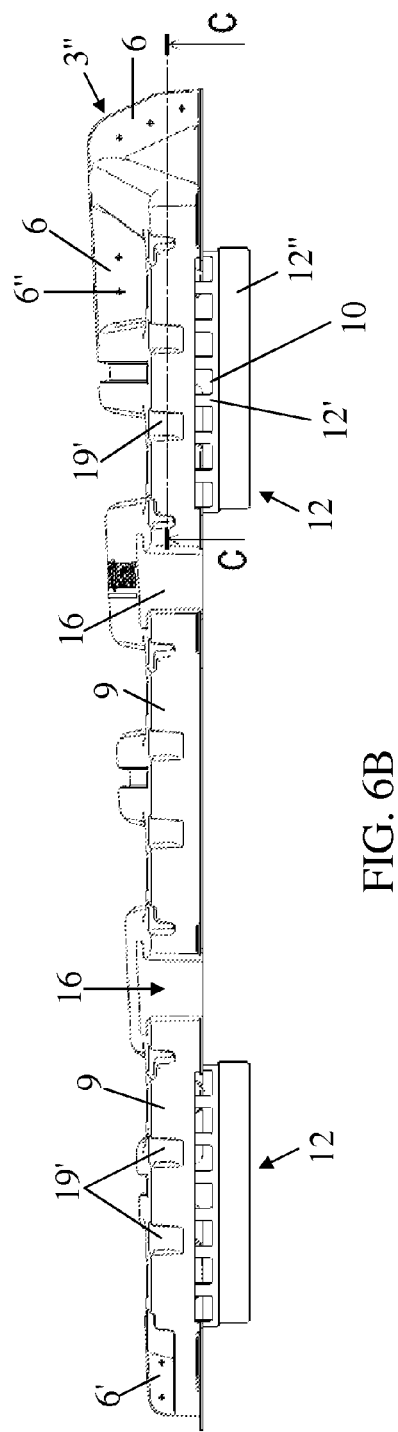
FIG. 6A
FIG. 6B

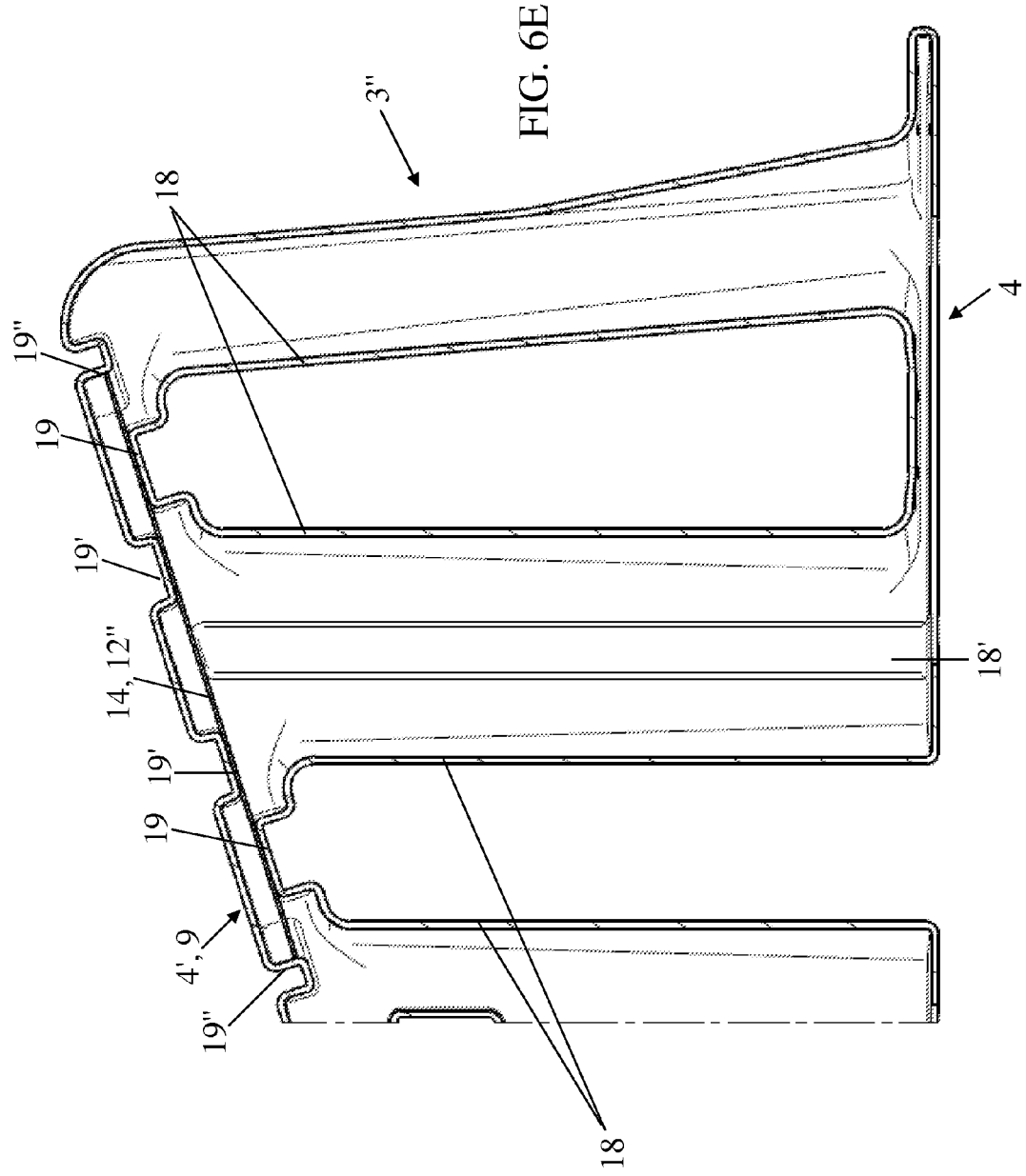

DEVICE FOR SUPPORTING AND ATTACHING PANELS OR THE LIKE, AND ROOF SYSTEM COMPRISING SUCH A DEVICE

This invention relates to the field of the roofing of buildings or covers of structures, more particularly the airtight covers that incorporate one or more sealing coverings formed by membranes or flexible and partially deformable sheets, and it has as its object a device for supporting and attaching elements in the form of plates, panels or the like on such roof covers.

The invention more specifically relates to the attachment of photovoltaic panels.

Numerous systems for mounting elements on plates, panels or the like on roof covers have already been proposed.

These known systems generally use one-piece elements made of polymer materials or assemblies of metal elements that make it possible to support the plates or panels in an inclined manner at some distance from the roof cover in question.

Thus, the documents WO 2009/077030 and US 2009/0266406, for example, disclose supports in the form of hollow bodies made of plastic materials that are capable of accommodating photovoltaic panels either in suitable reinforcements (US 2009/0266406) or between upper and lower holding pins (WO 2009/077030), with these supports being attached by anchoring on roofing or weighted to withstand wind.

These modular supports, several of which can be combined to form arrangements, can only accommodate one size of panel, however.

A frame for mounting and attaching photovoltaic panels, comprising supports in the form of an articulated triangular frame forming a semi-soft unit, is known from the documents FR 2 890 725 and FR 2 494 408.

These supports are assembled with one another to create a load-bearing structure and are attached to base parts secured by anchoring to the roofing. Their use requires difficult and tedious work on site, requiring very experienced operators.

The above-mentioned known solutions also have, in addition to the limitations already mentioned, the drawback of not being suitable for mounting on airtight covers formed by membranes or bituminous sheets, with the ballasting often being incompatible with the stress resistance of the cover or its support elements and attachment by conventional anchoring (screw, rivet, etc.) deteriorating the sealing of the cover.

Furthermore, different methods for attaching or connecting a sealing covering to its support are part of the state of the art and knowledge of one skilled in the art. This support can consist of, for example, a thermal insulator, a concrete slab, a cover made of wood or wood derivatives, a metal cover, etc.

In general, the sealing coverings are connected to the support (by thermal or adhesive bonding, by semi-bonding, by mechanical attachment) directly at the load-bearing element or the framework, or more generally with interposition of a thermal insulator between the load-bearing element and said sealing covering. This connection makes it possible in particular for the sealing, which forms the exposed layer, to withstand the effects of partial vacuum and the detachment stresses created by the wind.

When no particular connection of the covering with its support, or directly with the load-bearing element, is provided, it is said to be placed independently. In this case, ballasting is necessary to prevent it from detaching from the roofing and flying off, where this ballasting comes in the form of, for example, grit, slabs, small slabs or other massive cover elements, also depending in particular on whether or not the roofing in question is accessible and on the mechanical strength of the load-bearing element.

This invention relates more particularly to the roofing systems in which elements of plates, panels or the like that have inadequate weight for withstanding the action of the wind are installed on a sealing covering that is connected to its support, whereby said covering consequently has to contribute to the wind resistance of the connected panels or plates.

Solid support blocks made of foamed material with an inclined upper surface, constituting support parts for photovoltaic panels, are already known from the document DE-A-20 2009 005 202.

These blocks comprise, on their lower surfaces, rails for the attachment of a bituminous membrane that is capable of being secured to the covering of the roofing.

These blocks also comprise, on their upper surfaces, transverse rails (therefore perpendicular to the direction of the slope formed by the incline) for the attachment of photovoltaic panels, which rest on the entire surface of said blocks, whose size is consequently to be adapted.

In addition to the significant bulkiness of the blocks used, the large quantity of material necessary for their manufacturing and the obligatory use of rails for their lower attachment to the membrane, this known solution does not allow satisfactory cooling of supported panels.

Furthermore, a base for mounting solar collectors formed by an adjacent arrangement of light and hollow parts with an inclined upper surface, on which the collector panels rest, is known from the document DE-A-10 2007 019 596.

These support parts are secured to the roof covering, on the one hand, by a peripheral attachment edge made of a membrane-type material or film adhering to said covering, and, on the other hand, inside the hollow parts, by screw pins passing through said covering.

Taking into account the method of mounting panels, these support parts require the use of support parts of a size that is adapted to that of the panels, with an integrated cooling system for preventing excessive temperature spikes. In addition, their use means piercing at least the upper covering of the roofing.

In this context, the invention has as its object to provide a solution for the support and attachment of elements on plates, panels or the like, in particular photovoltaic panels, which are capable of adapting to panels of different sizes and do not require any particular ballasting or any through attachment able to interrupt or to generate any discontinuity in the sealed covering of the roof or analogous support surface.

In addition, the proposed solution should allow good ventilation of the rear surfaces of the panels and allow easy mounting of accessories such as pipes or the like.

In addition, the proposed solution should be simple to use on site, be suitable for large-scale production, not generate significant excess weight and be of moderate cost.

For this purpose, the invention has as its object a device for support and attachment of elements in the form of plates, panels or the like on a building roof cover, at some distance from the latter, with said cover comprising on the surface a covering or a sealing layer connected to the essentially continuous support forming the roof, to an underlying layer or sealing covering, or to a thermal insulation layer covering this support, the device comprising inclined support and holding brackets for the elements in the form of plates, panels or the like, arranged in a separated manner according to at least one alignment, each of these brackets having a lower portion designed to rest on the surface of the cover and to be secured to the latter, and at least one upper portion designed to support directly or indirectly one or more elements in the form of plates, panels or the like, at least some brackets, preferably all of the brackets, having, seen from the side, a triangular structure whose base is formed by the lower portion and whose side(s) defining with the base an acute angle is (are) formed by the upper portion(s) ensuring the inclined support and holding, each bracket consisting primarily of a hollow body, which may or may not consist of a single piece, device characterized in that the lower portion of at least some brackets, preferably each bracket, is provided on the underside with at least one portion of plate, panel, membrane or sheet, forming a connecting portion (also denoted herein as protector(s) or connected protector) that is secured to the bracket, with the protector or each protector consisting of a material or being based on a material that is compatible with and/or of the same nature as the layer or the covering on the surface of the cover, and being connected to this layer or to this covering by an adhesive connection, and in that the upper portion comprises one or more portions of wall of said hollow body providing one or more elongated support surface(s) for the lateral edges of the panels or the like or for profile members for mounting such panels.

The invention will be better understood, using the description below, which relates to preferred embodiments, provided by way of nonlimiting example and explained with reference to the accompanying schematic drawings, in which:

FIGS. 6A and 6B are respectively internal and top lateral front views of a half-shell that is part of a bracket as shown in an exploded manner in FIG. 2B, with the two plates comprising anchoring or hooking sites being in place (by interlocking);

FIGS. 6C, 6D and 6E are views on a different scale of the cutaways A-A and B-B of FIG. 6A and the cutaway C-C of FIG. 6B;

Figure 1A:
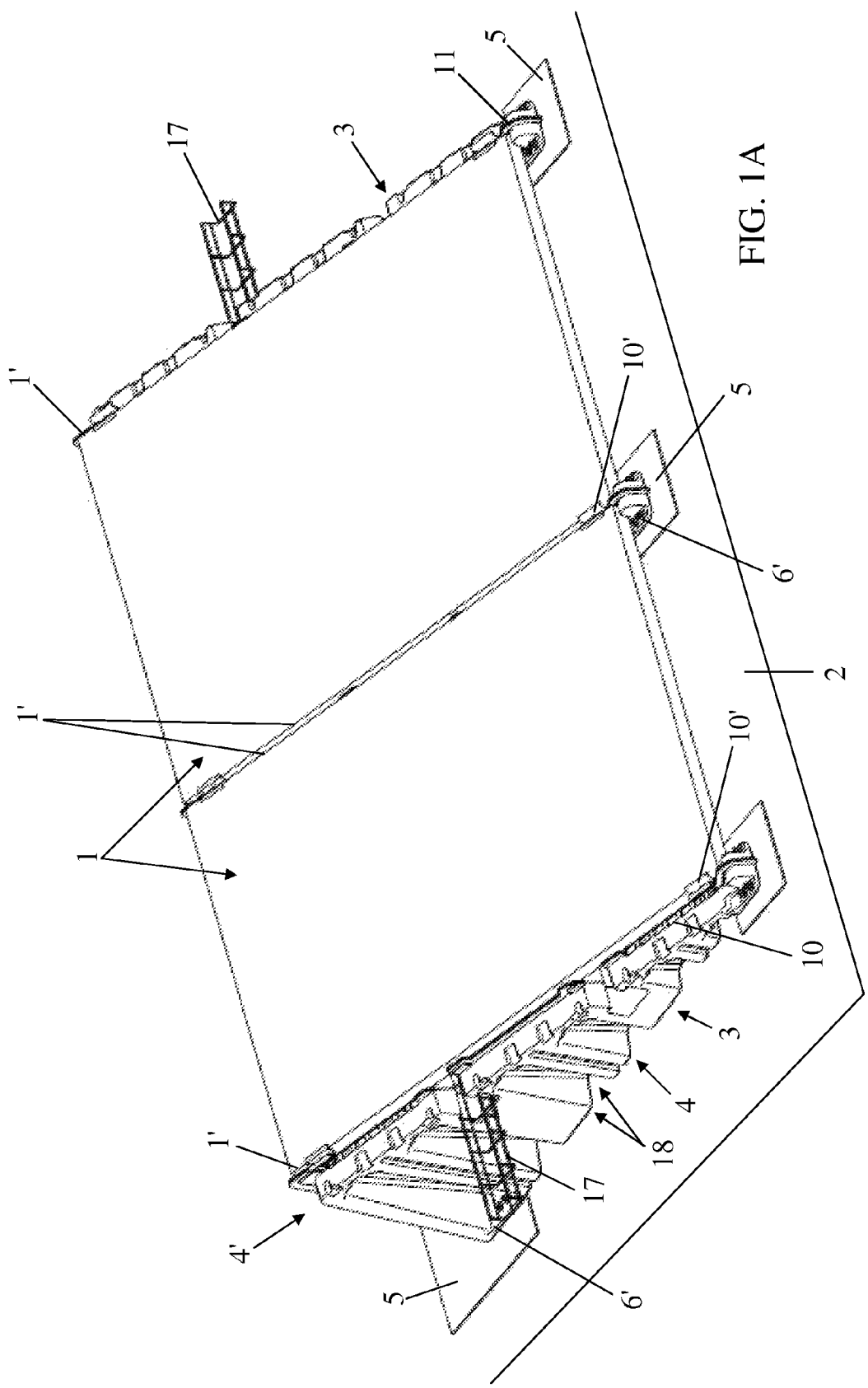
FIGS. 1A and 1B are perspective views of a portion of a support and attachment device according to an embodiment of the invention, comprising three support and holding brackets, and respectively supporting two and four panels.
Figure 1B:
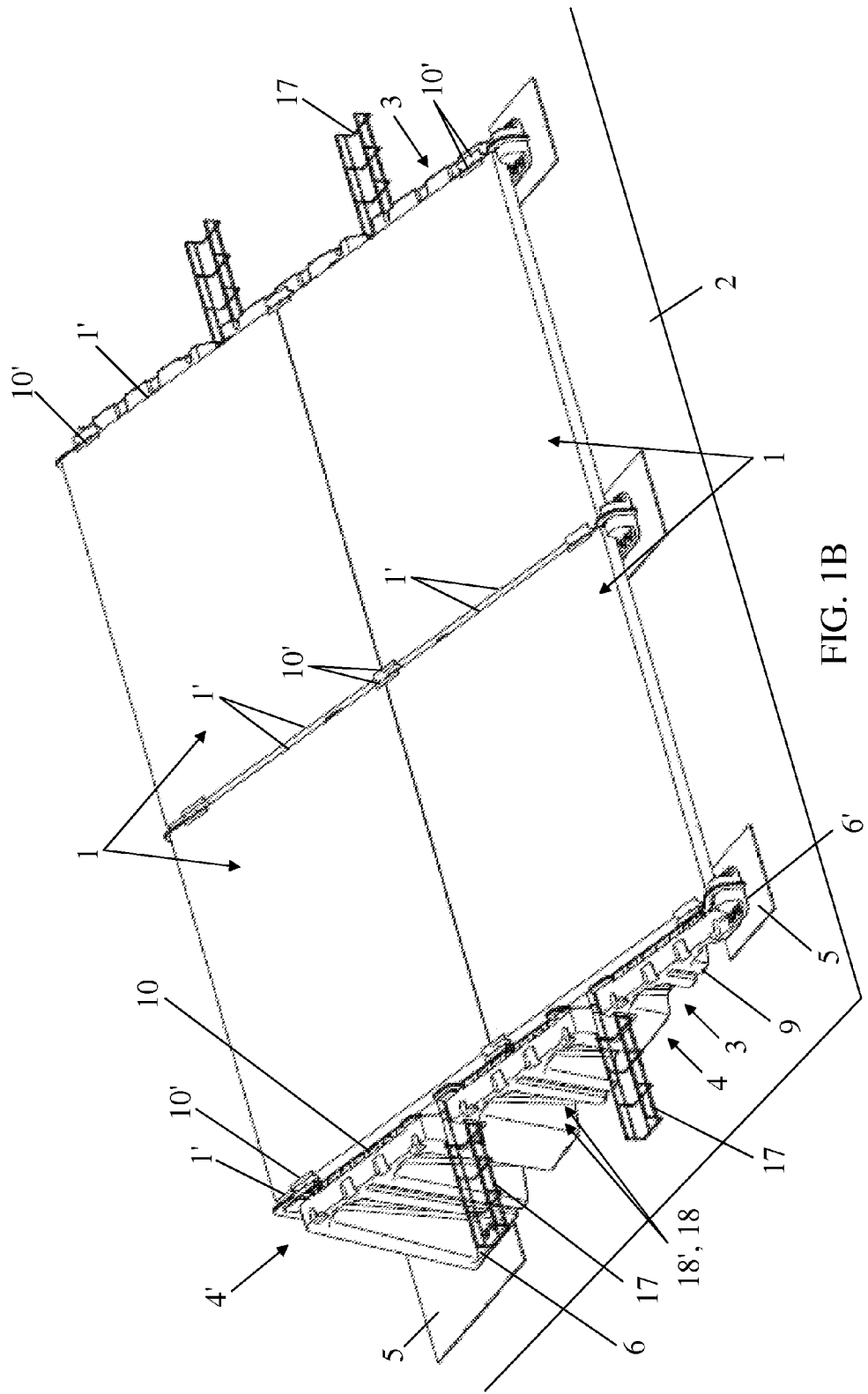
Figure 8:
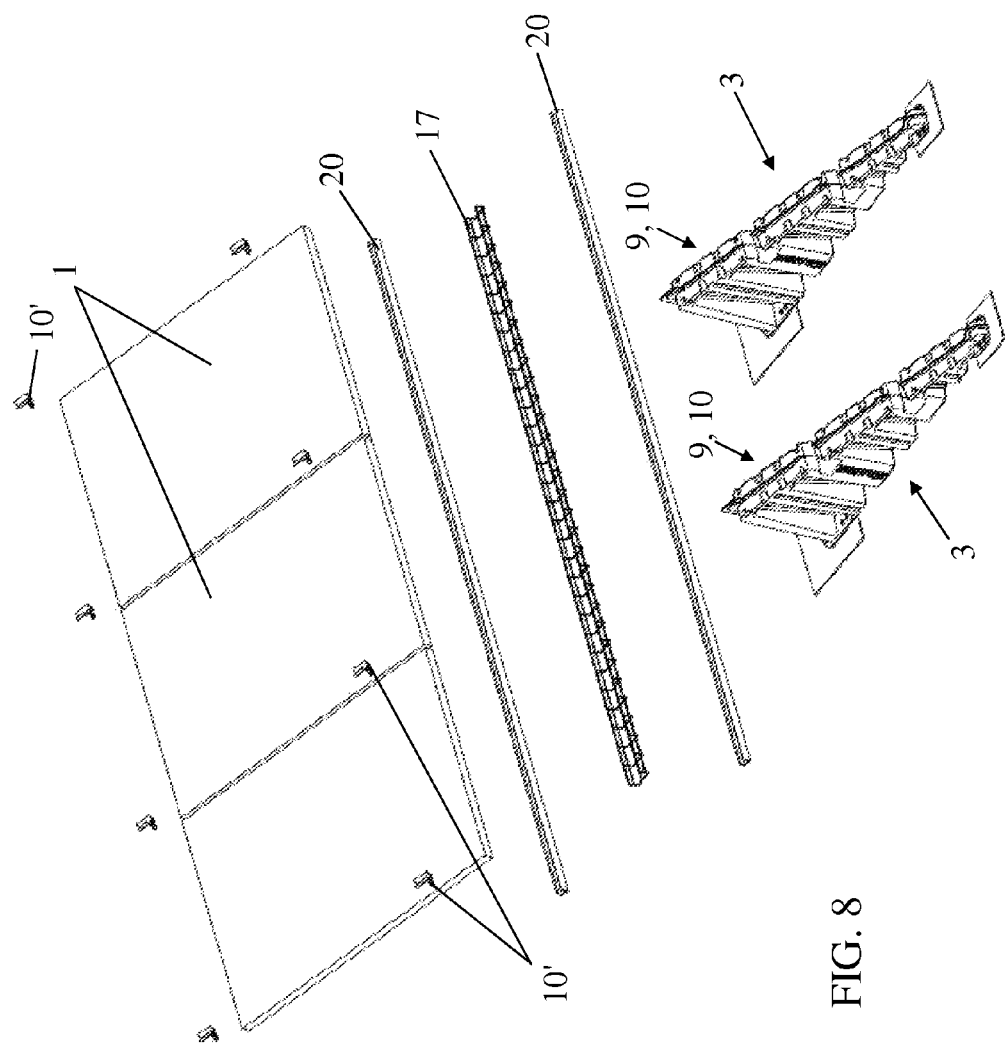
FIG. 8 is an exploded view of a device according to another embodiment of the invention.

FIGS. 1A, 1B and 8 of the accompanying drawings partially show a device for supporting and attaching elements 1 in the form of plates, panels or the like on a building roof cover 2, at some distance from the latter, with said cover 2 comprising on the surface a covering or a sealing layer connected to the essentially continuous support that forms the roof, to an underlying layer or sealing covering, or to a thermal insulation layer covering this support.

This device comprises inclined support and holding brackets 3 for the elements 1 in the form of plates, panels or the like, arranged in a separated manner according to at least one alignment, each of these brackets 3 having a lower portion 4 that is designed to rest on the surface of the cover and to be secured to the latter and at least one upper portion 4' that is designed to support directly or indirectly one or more elements 1 in the form of plates, panels or the like, at least some brackets, preferably all of the brackets 3, having, seen from the side, a triangular structure whose base is formed by the lower portion 4 and of which the side(s) defining an acute angle with the base is (are) formed by the upper portion(s) 4' ensuring the inclined support and holding, with each bracket consisting primarily of a hollow body that may or may not consist of a single piece.

This device is characterized in that the lower portion 4 of at least certain brackets 3, preferably each bracket 3, is provided on the underside with at least one connecting portion 5 of plate, panel, membrane or sheet, forming a connected protector that is secured to the bracket 3, with the connecting portion(s) 5 consisting of a material or being based on a material that is compatible with and/or of the same nature as the layer or the surface covering of the cover 2 and being connected to this layer or to this covering by an adhesive bond.

In addition, each upper portion 4' comprises one or more portions of wall of said hollow body 3' providing one or more elongated support surface(s) 9 for the lateral edges 1' of panels or the like or for profile members for mounting such panels.

The use of such connecting portions 5 inserted between the lower portion 4 and the layer or the sealing covering of the cover 2 makes it possible, on the one hand, to obtain a very resistant connection with a distribution of tensile stresses on a large area of the layer or the covering, and, on the other hand, to limit the shear or cutaway stresses exerted on the edge of the lower portion 4 on said layer or said covering (damping cushion function of the connection portion 5).

In addition, taking into account the nature of the material that forms this connecting portion 5, its temperature behavior (in particular in terms of contraction and expansion) will be similar, and even identical, to that of the layer or the upper covering of the cover 2, preventing the generation of stresses at the contact interface between these two components.

Although other connection types can be considered, each connecting portion 5 is preferably attached mechanically to the corresponding lower portion and has a significant deformation and tear resistance.

Based in particular on the nature of the upper layer of the cover 2 of the targeted application and/or desired performances, connecting portions 5 of varied type, nature and dimensions can be combined with the same type of brackets 3.

The support of the panels or the like only at their lateral edges, optionally by means of rails 20, allows cooling by circulation of air on the underside of said panels.

This cooling is also facilitated by the separated arrangement of pairs of brackets 3 together supporting such a panel 1.

The lower portion 4 comprises surface support areas 6, 6', 22, of which at least a portion is combined with at least one connecting portion 5.

Advantageously, and as FIGS. 1A, 1B, 3, 4A and 4B of the accompanying drawings show, the lower portion 4 of each bracket 3 has at least one lateral formation 6, 6' of the flat-surface type or the like, providing, each if necessary, an external support area, designed to work by surface contact with the one of the connecting portions 5 and provided with several openings 6" for accommodating elements 7 for mechanical attachment, with the latter passing through the corresponding connecting portion 5 and each being combined with a small plate, optionally a common small plate, or with a washer 8 that is designed to press locally said connecting portion 5 against said lateral formation 6, 6' from below.

In a preferred manner, the lower portion 4 of each bracket 3 has an outside surface support area at least at each of its opposite longitudinal ends, preferably extending symmetrically from each side of the bracket 3 being considered, a connecting portion 5 being attached, preferably mechanically, at each of said ends, under the lower surface support areas of lateral formations 6, 6' for support of said lower portion 4 and with a surface extension that is respectively larger than the latter.

Figure 3:
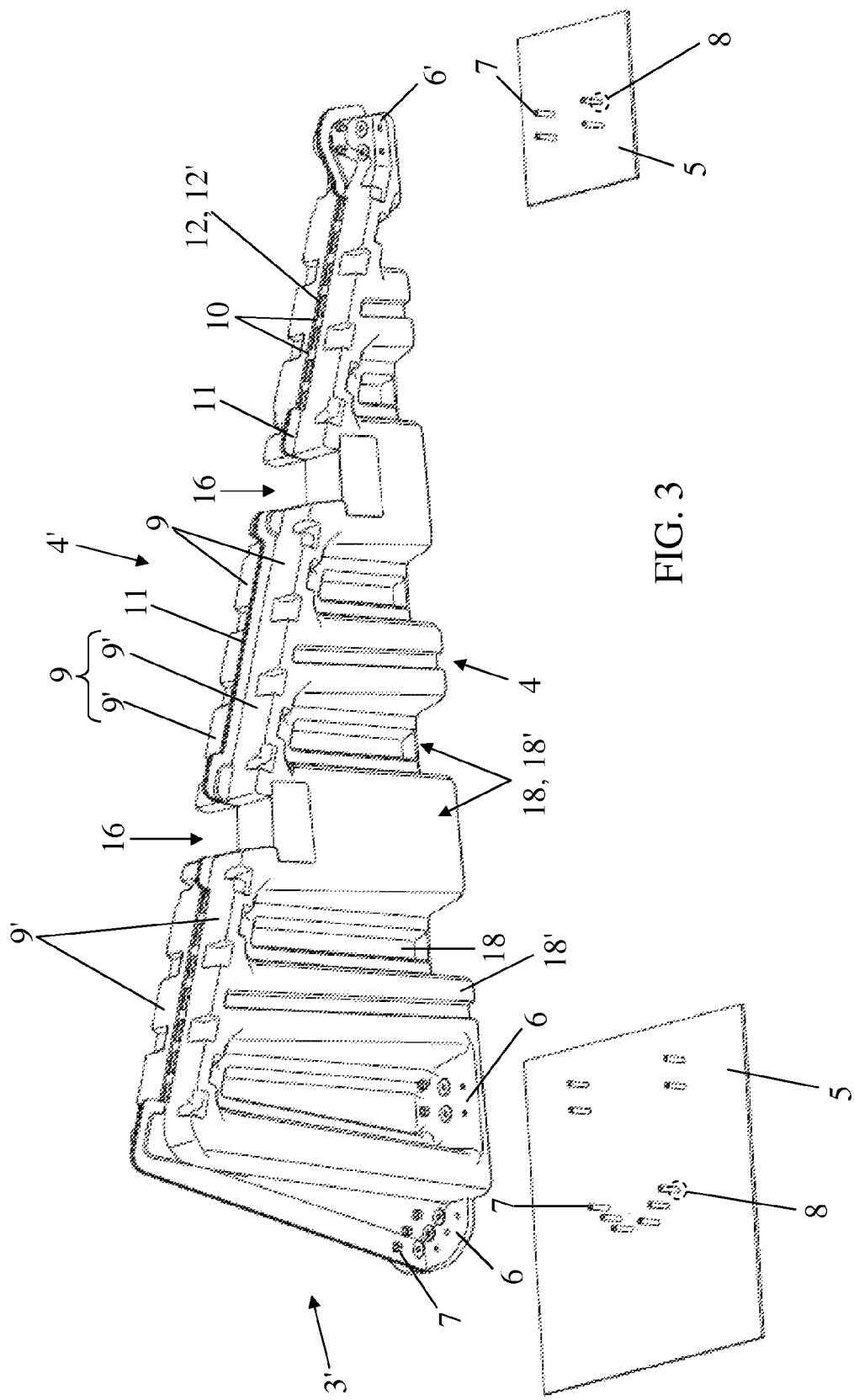
FIG. 3 is a perspective view of the hollow body of the bracket of FIG. 2B before attaching protectors.
Figure 4A:
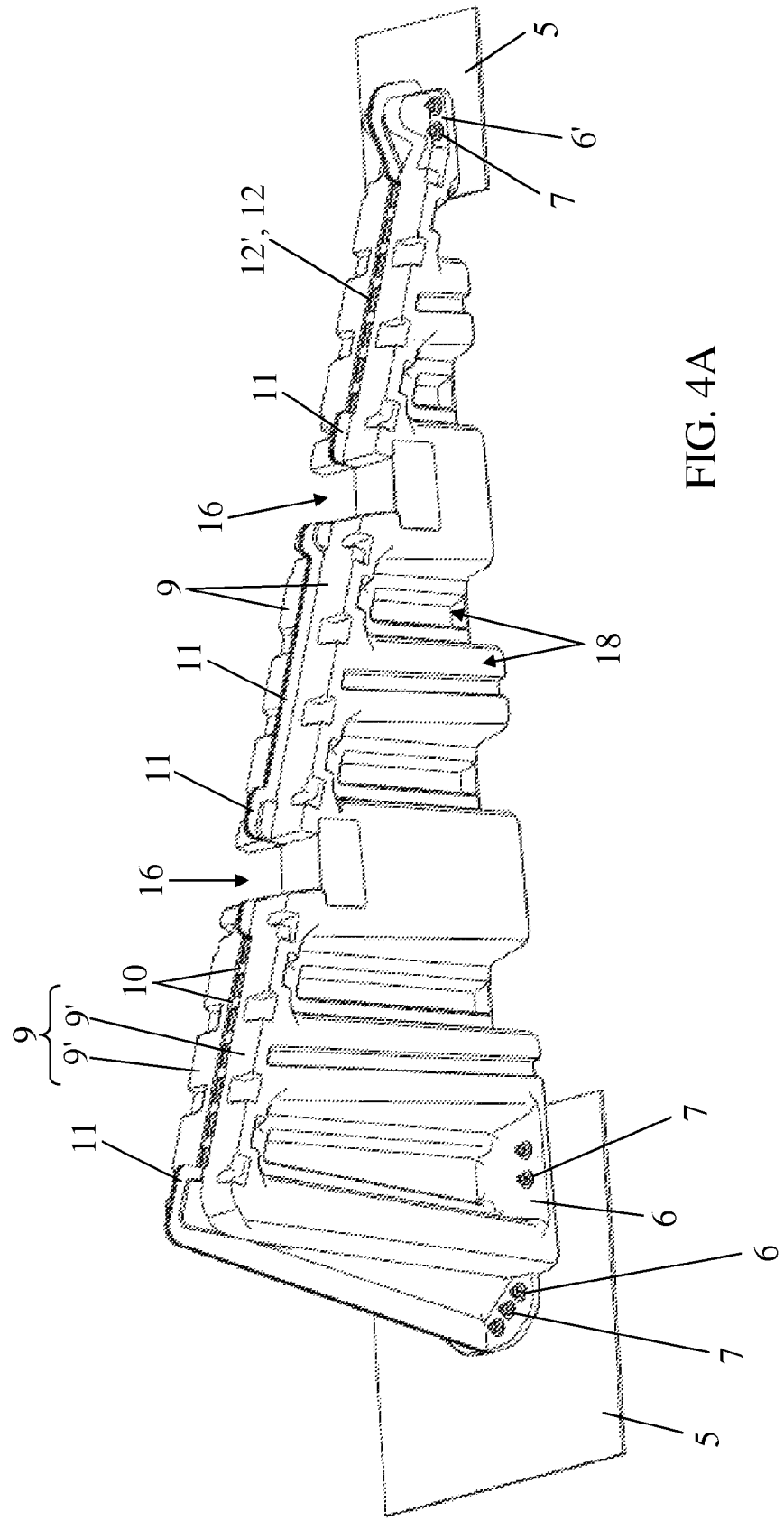
FIGS. 4A and 4B are respectively perspective and lateral front views of the bracket shown in FIG. 3, after attaching protectors.
Figure 4B:
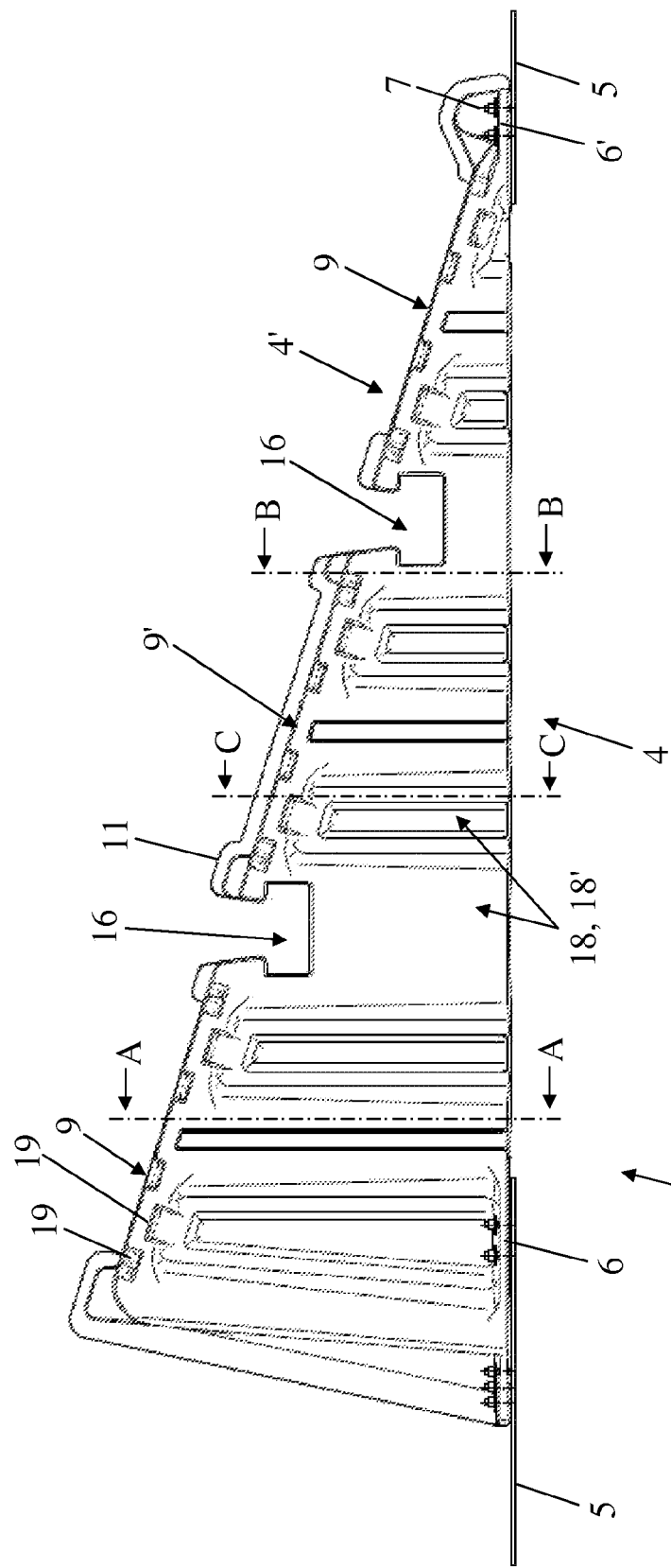

As in particular FIGS. 3, 4A and 4B of the accompanying drawings show, the connecting portions 5 extend continuously under the lower portion 4 of each bracket 3, at least at the lateral formation areas 6, 6', and even under the entire surface of the underside of said lower portion 4 and beyond the outside perimeter of the latter, or at least of these formations.

The surface adhesive connection between the connecting portion 5 and the layer or surface covering of the cover 2 can be produced according to different techniques that are known to one skilled in the art, if necessary based on the nature and the type of materials that constitute the connecting portion 5 being considered and the layer or surface covering.

Thus, this surface adhesive connection can consist of, for example:
  A bonding connection, with the bonding agent being a connected additional agent,
  A cold adhesion connection, the underside of the connecting portion 5 comprising a covering that has suitable properties (for example, self-adhesive underside).

However, in accordance with a very advantageous variant embodiment of the invention, preventing the use of an additional bonding agent or a particular underside covering of the connecting portions 5, the surface adhesive connection between the latter and the layer or the surface covering of the cover 2 is a welding connection (for example with the flame of a blowtorch or with hot air), with the connecting portion 5 and the layer or surface covering then preferably being based on a bituminous or synthetic sealing membrane.

For the purpose of obtaining a value of maximum adhesive force, the surface adhesive connection between each connecting portion 5 and the layer or the surface covering of the cover 2 essentially extends over the entire surface of the underside of the connecting portion 5 being considered (the small plates or washers 8 mentioned above corresponding to areas that may or may not be adhesive to the layer or the surface covering).

Although a surface area of the connecting portions that is larger than that of the support areas of the lateral formations 6, 6' makes it possible to achieve higher bonding performances, it is also possible to consider equal surface areas, and even a smaller surface area for a connecting portion, in particular when the desired performances are more limited and/or when the nature of the connection provides adequate performances.

With no sealing function being specifically desired, said adhesive connection can be either of a continuous nature at the underside of the connecting portion 5 or of a discontinuous nature with the creation of radial or peripheral unconnected areas.

By way of nonlimiting examples of the types of sealing coverings, it is possible to cite, on the one hand, those of modified bitumen, preferably with self-protection, making possible a quick connection of the connecting portions 5, and, on the other hand, those in the form of flexible or rigid, synthetic resin-based membranes (naturally without self-protection).

The surface sealing covering of the cover 2 advantageously can be a bituminous double layer, which corresponds to a solution with very high reliability and durability, resting directly on the support or generally on a thermal insulation layer.

By way of practical example of a sealing covering, it is possible to mention a standard system that consists of two SBS-modified bitumen sheets, with the first layer 2.5 mm thick being reinforced by a non-woven glass fabric of 50 g/m$^2$, and with the second layer also being 2.5 mm thick and also reinforced by a glass fabric of 50 g/m$^2$.

A highly reinforced system that is cited as an example can consist of two SBS-modified bitumen sheets, the first sheet 2.5 mm thick being reinforced by a polyester-glass composite of 130 g/m$^2$ and the second layer 3.5 mm thick being reinforced by a polyester-glass composite of 250 g/m$^2$.

Among the techniques that are known to one skilled in the art, the sealing covering is connected to its support at least in semi-independence and preferably by adhesion.

The most common example of a semi-independent installation method is the one by mechanical attachment that is directly linked to the load-bearing element or the support.

As indicated above, a double-layer system should be preferred. The sheets of the first layer are then assembled according to the description that is developed in, for example, the Technical Notice 5/06-1903 by being placed freely on their support that is in general an insulating panel 10 cm thick, for example, and then their covers that are several centimeters wide and that include the through mechanical attachment are welded so as to make them airtight. The sheets of the second layer are next welded fully on those of the first layer.

As already indicated above, there is generally virtually always insulation under the sealing cover.

The particularly suitable insulators within the framework of the invention as sealing supports are of class C in compressive strength according to the UEATC guide and generally come in the form of panels.

Furthermore, it is understood that any insulating panel that can accommodate, in full bonding or semi-bonding, a sealing covering experiences its own performance relative to the wind, as a function in particular of its inner cohesion. This capability is generally deduced from its tensile strength perpendicular to the two surfaces of the insulating panel.

The connecting portions 5 that can be used within the framework of the invention can be of different types and of different natures of materials.

Thus, according to a first practical variant, the connecting portion 5 can consist of a sheet or bituminous membrane portion (for example of 40 cm×40 cm in size) with either an upper surface that is self-protected by slate flakes or an upper surface of SEBS-modified bitumen that is UV-resistant.

The sheet that is self-protected by flakes, defined in its CSTB Technical Notice No. 5/08-1993, is a membrane 4 mm thick that is based on bitumen that is modified by the SBS elastomer, reinforced by a non-woven polyester substrate of 250 g/m$^2$ with strong mechanical tensile strength (on the order of 1,000 N/5 cm according to EN 12311-1) and a significant tear resistance of the nail (on the order of 300 N according to EN 12310-1).

The sheet with an SEBS-modified bitumen surface, defined in its CSTB Technical Notice No. 21/09-06, is a membrane 3.5 mm thick, reinforced by a 250 g/m2 polyester-glass composite substrate with a tensile strength of 1,500 N/5 cm and a tear resistance of approximately 250 N.

The bituminous sheet can also be based on PPA (atactic polypropylene)-modified bitumen with an upper surface without self-protection.

According to a second practical variant, the connecting portion 5 can consist of a portion of flexible synthetic membrane of the type TPO (thermoplastic polyolefins) or PVC (polyvinyl chloride), for example 30 cm×30 cm.

These two synthetic membranes, for example 1.5 mm thick, can be reinforced by a polyester grid of 110 g/m² with high tensile strength (of at least 1,000 N/5 cm according to EN 12311-2) and with a very high tear resistance (250 N according to EN 12310-2).

In accordance with a third practical variant, the connecting portion 5 can consist of a plate or a rigid synthetic membrane (for example, 20 cm×20 cm) based on, for example, PEHD (high-density polyethylene). Such a synthetic membrane has an adequate mechanical tensile strength and an adequate tear resistance without this membrane being reinforced.

Finally, it can also be considered to use a connecting portion 5 with two components (stratified structure), with the upper component being compatible with the bracket 3 and the lower component being compatible with the sealing covering of the cover 2.

As the figures of the accompanying drawings also show, and in accordance with an embodiment of the invention that provides a solution that is light, strong, and easy to manufacture and to use, it may be provided that each bracket 3 consists of a hollow body 3', made of a single piece or not, obtained by molding or thermoforming of a polymer material. In addition, the upper portion 4' can comprise one or more wall portion(s) of said hollow body 3' that provide(s) one or more elongated support surface(s) 9 for the lateral edge (1') of a photovoltaic panel 1 or the like, for the lateral edges 1' of at least two photovoltaic panels or others mounted side-by-side (with the edges 1' being adjacent at the brackets) or for profile members 20 for mounting such panels 1 or the like (FIGS. 1A and 1B).

The panels 1 or the like can consequently either rest directly on the upper portions of the brackets 3, with the spacing between the latter then being adapted to one of the dimensions (lengths or widths) of said rectangular panels, or be mounted on intermediate profile members 20, essentially in a mutually adjacent manner, these profile members being attached to the brackets 3 (spacing between the latter then depending only on the feedstock to be supported).

Of course, the brackets 3 that are located at the end of alignment will support panels 1 only on a single side.

For the purpose of providing a rigid and resistant hold to panels 1 or the like, while allowing easy assembly and disassembly of the latter, each bracket 3 advantageously comprises a large number of hooking or anchoring sites 10 for removable engagement means 10' for a lateral attachment of panels or the like 1 that are directly supported by the bracket 3 being considered or for an attachment of intermediate profile members 20 for mounting such panels or the like 1, with these sites 10 being distributed along the elongated support surfaces 9 of the upper portion 4 of the bracket 3 being considered.

In accordance with a preferred practical embodiment of brackets 3, each elongated support surface 9 is subdivided in the direction of its greatest length by stop means 11 into two elementary surfaces 9', each capable of supporting a lateral edge 1' or a portion of a lateral edge 1' of a panel or the like 1, and the hooking or anchoring sites 10 come in the form of perforations made in one or more metal plates 12 that are integrated in the hollow body 3' of the bracket 3 in question.

The hollow body 3', preferably made of a thermoplastic or optionally thermosetting material, can, of course, be manufactured in one piece by molding, with the plate(s) 12 then being prepositioned in the corresponding mold and at least partially over-molded.

Figure 2A:
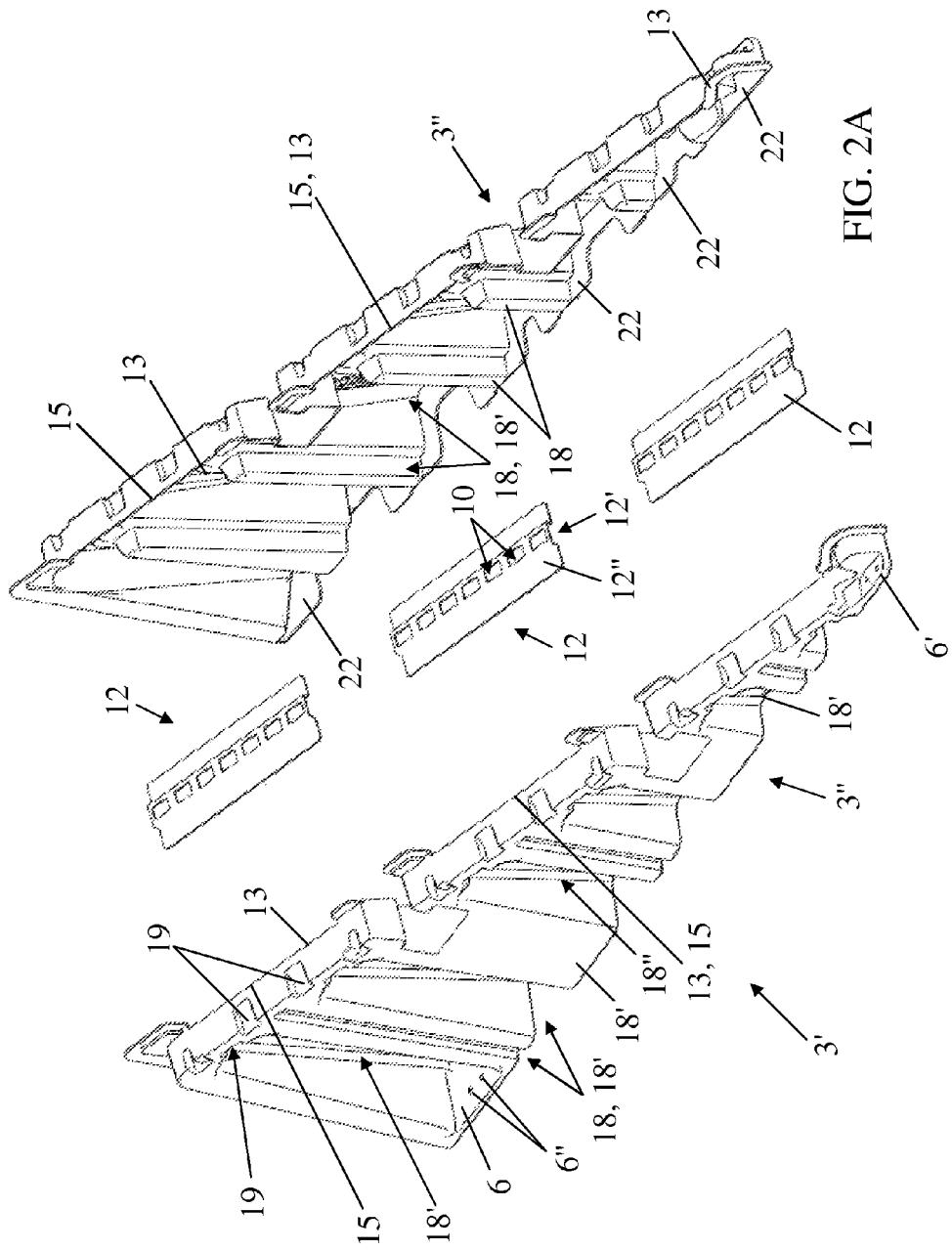
FIGS. 2A and 2B are exploded perspective views of a hollow body of a bracket according to two variant embodiments of the invention.
Figure 2B:
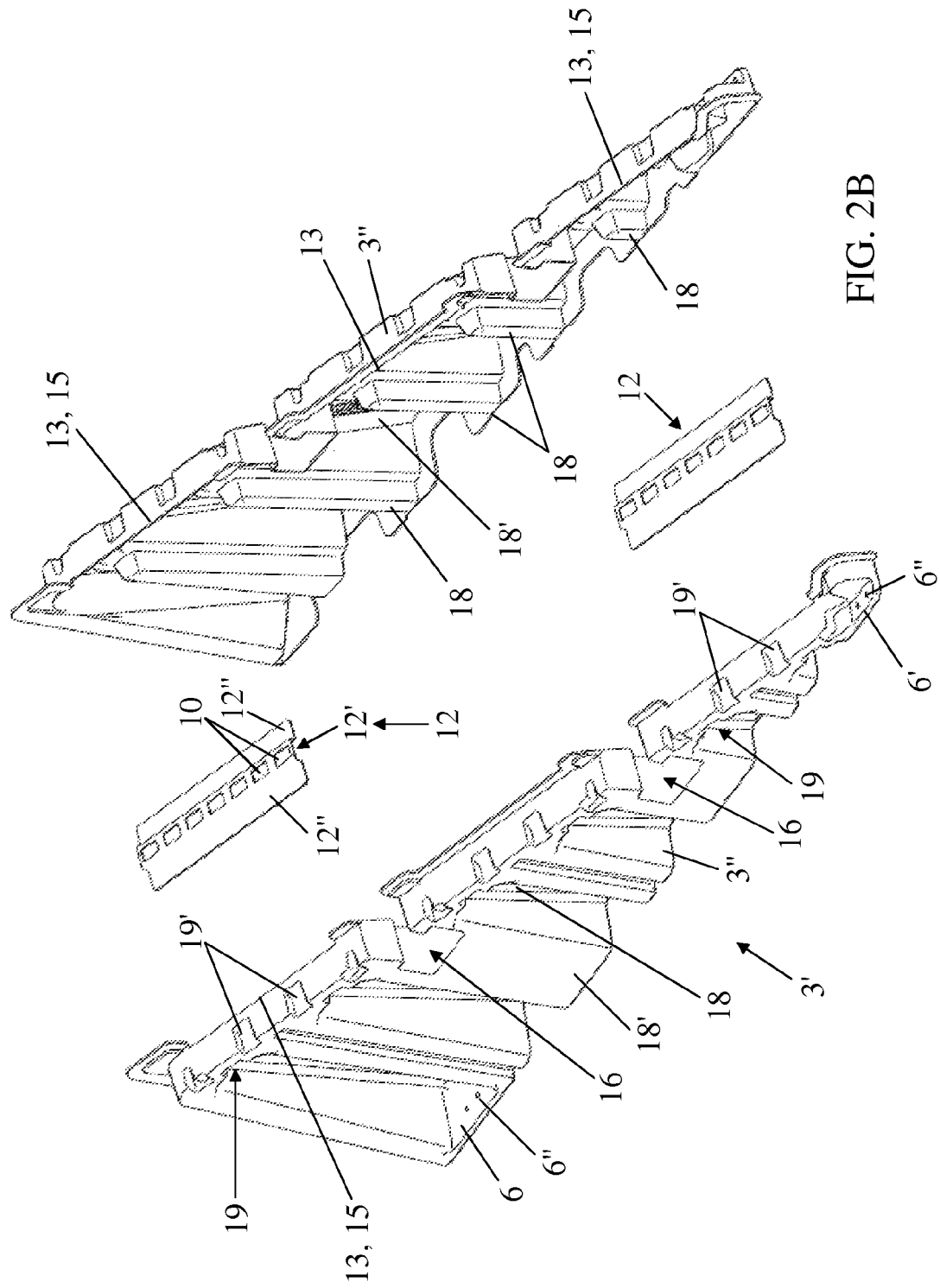

However, in accordance with a very advantageous variant embodiment of the invention that emerges in particular from FIGS. 2A and 2B of the accompanying drawings, the hollow body 3' consists of two complementary half-shells 3'', having symmetrical shapes, and assembled with one another along a median plane at least at the peripheral edges 13 in contact with said half-shells 3'' and optionally at the formations 18, projecting toward the inside and in mutual contact, of the two half-shells 3''.

The assembly between the half-shells 3'' can optionally combine a mechanical assembly, for example by cooperation of a complementary shape, with an assembly by gluing, welding, or the like.

These two half-shells can consist of a synthetic material, as indicated above, or as a variant of a metal material, for example based on aluminum, treated steel (sheet metal) or stainless steel.

As FIGS. 2 to 6 of the accompanying drawings show, it can be provided that hooking or anchoring sites 10 for removable means 10' for lateral attachment of panels 1 or the like in the form of metal plates 12 that are elongated and pierced along a central strip 12' are combined with at least some of the elongated support surfaces 9 of the upper portion 4 of each bracket 3, with these plates 12 comprising, on both sides of said central strip 12', lateral wings 12'' that are embedded in suitable receiving gaps 14 that are formed in, close to or under the wall portions 9 that form the upper portion 4' of the bracket 3, in such a way that said elongated metal plates 12 are rigidly held in the hollow body 3' by opposite interlocking after assembly of the two half-shells 3'', with the central perforated strip 12' of each plate 12 having hooking or anchoring sites 10, with said strip being visible through an opening formed by the cooperation of suitable cutouts 15 of wall portions 9 of the two half-shells 4'.

Thus, the securing of plates 12 in the bracket 3 is achieved in a purely mechanical manner without requiring additional attachment means.

Figure 5A:
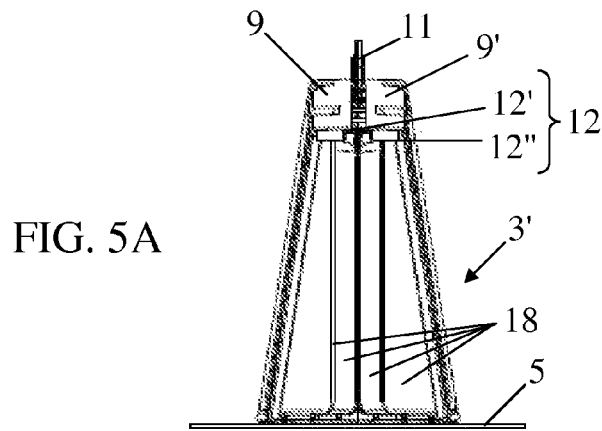
FIGS. 5A, 5B and 5C are transverse cutaway views along A-A, B-B and C-C of the bracket shown in FIG. 4B.
Figure 5B:
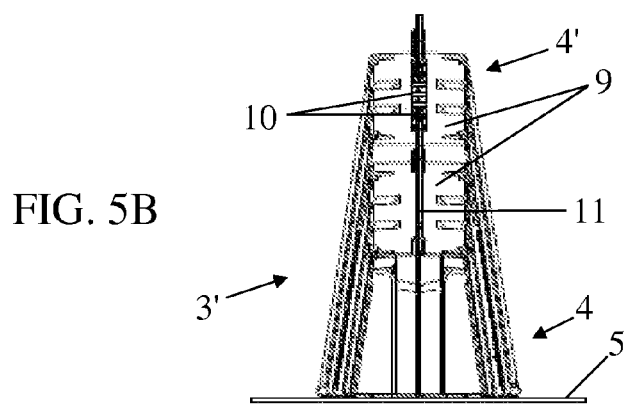
Figure 5C:
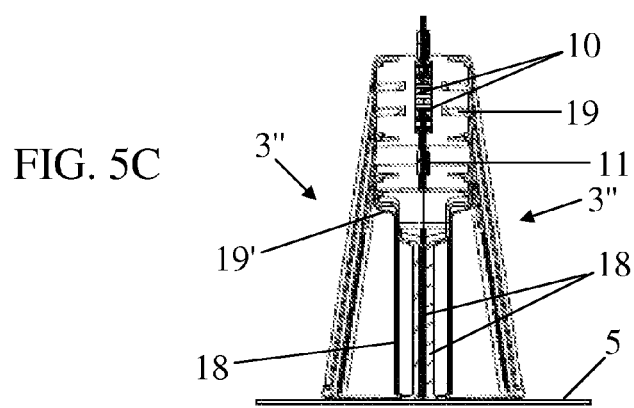
Figure 6D:
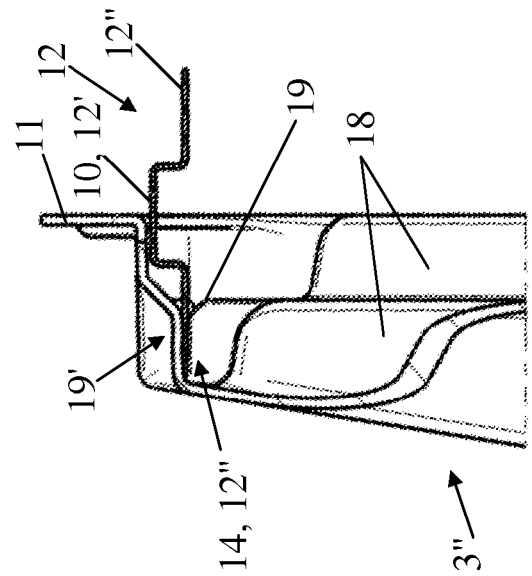
Figure 6C:
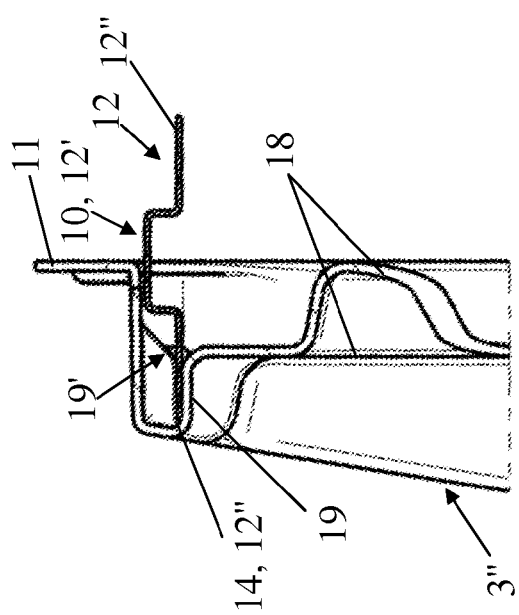
Figure 7A:
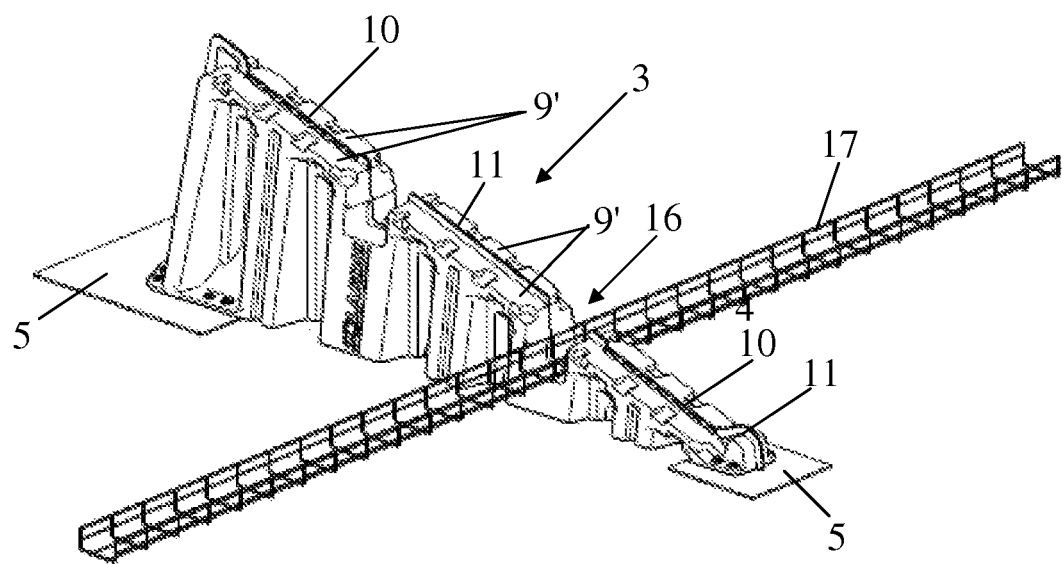
FIG. 7A is a perspective view of a bracket that is part of the device according to the invention, equipped with a cable path.
Figure 7B:
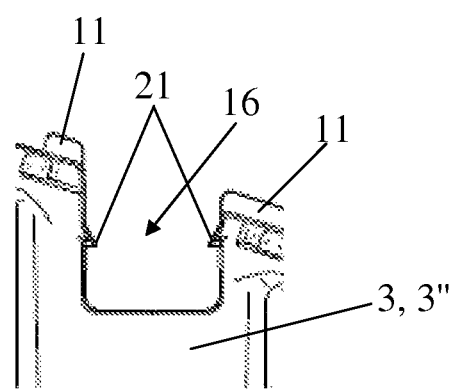
FIG. 7B is a lateral front detail view of a through bearing for a cable path of a bracket as shown in FIG. 7A.

More specifically and by way of nonlimiting example shown more particularly in FIGS. 4, 5 and 6 of the accompanying drawings, each half-shell 3'' can comprise, at the upper portion 4' of the bracket 3 being considered, local deformations 19, 19' of the side wall and wall portions forming the elongated support surfaces 9, which define by cooperation the receiving gaps 14 for the lateral wings 12'' of the plates 12.

At least some 19 of these local deformations 19, 19' can consist of end portions of formations of reinforcement and rigidification 18 of the hollow body 3'.

These alternate local deformations 19 and 19' have opposing, but offset, contact surfaces, whose spacing is such that it advantageously allows retention with optional clamping of the lateral wings 12'' of the plates 12.

Additional deformations 19'' of the wall of the half-shell 3'' can optionally bring about a longitudinal wedging of these plates 12.

The portions of the deformations 19 and 19' in contact with the wings 12'' advantageously have planar contact surfaces with the latter, forming discontinuous walls of the corresponding gap 14 in the shape of a slot.

The formations 18 can increase, if necessary, the amplitude of the widening toward the bottom of the hollow bodies 3'' of the brackets 3, and themselves end in flat surfaces 22.

For the purpose of eliminating the need for a possible spacing of the brackets 3 imposed by the dimensions of the panels 1 and optionally for increasing the density of implantation of said panels 1, the device according to the invention can, as, for example, FIG. 8 of the accompanying drawings shows, also comprise, for each alignment of brackets 3, at least two profile members 20 extending parallel in the direction of the alignment of the brackets 3, resting on the support surfaces 9 that are elongated and secured to anchoring or hooking sites 10, whereby these profile members 20 have removable engagement sites for the panels 1 or the like, making possible an adjacent mounting beside the latter on said profile members 20.

In accordance with an additional characteristic of the invention, emerging in particular from FIGS. 1A, 1B, 3, 4, 7A and 7B, the upper portion 4' of the hollow body 3' of each bracket 3 comprises multiple elongated support surfaces 9, separated from one another by one or more through transverse cavity(ies) or cutout(s) 16 that consist of local deformations of its wall of the hollow body 3' and each adapted to constitute a support bearing for an elongated element 17 such as a pipe, channel, funnel, cable path, or the like.

The support bearings 16 can optionally comprise means 21, for example in the form of catches, for blocking funnels 17.

Preferably, the hollow body 3' of each bracket 3, optionally formed by assembly of two thermoformed half-shells 3", is made of a polymer material that is selected from the group that is formed by high-density polyethylene (HDPE), polycarbonate, an ABS/PMMA mixture, and polypropylene.

In the case of an ABS/PMMA structure, the walls of the hollow body 3' advantageously offer a double structure with an ABS structural inside component, providing mechanical strength, and a PMMA protective outside component (protection against UV radiation and more generally climatic and atmospheric agents).

It is advisable to note that the above-mentioned polymer materials can at least partially be recycled materials.

In addition, so as to increase the compressive strength of the hollow body 3' and to increase the stability of its positioning on the cover 2, said hollow body 3' can comprise hollow and projecting reinforcement formations 18, 18' at its side walls, the latter being divergent in the direction of the lower portion 4 of the hollow body 3', with the two half-shells 3" being, if necessary, assembled by gluing, welding, elastic interlocking or catch interlocking, mechanical attachment, for example by screws/nuts, or the like.

In accordance with an advantageous practical embodiment of the invention emerging in an obvious manner from FIGS. 5 and 6 of the accompanying drawings, the hollow bodies 3' of the brackets 3 have a tapered shape from their upper portion 4' to their lower portion 4, thus having a truncated shape in cross-section.

In an advantageous manner, the lower portion 4 of each bracket 3 has an open structure on the underside and the corresponding hollow body 3' comprises, in addition to the outside lateral formations 6, 6', also inside lateral formations 22, for example in the form of wings extending the end of the side walls, constituting support areas at the lower edges of the walls of said hollow body 3'.

Despite a perforated and cut-out structure on the underside (less material, ease of manufacturing, evacuation of water), the results are thus increased lateral stability, a larger support surface reducing the compressive stresses on the underlying insulating material, and, finally, automatic layout of a space between the upper portions 4' of two adjacent brackets 3, allowing in particular passage for the circulation of air.

The invention also relates to a roofing system with two integrated components comprising a lower airtight cover with a covering or a surface sealing layer, preferably a synthetic or bituminous sealing membrane, and an upper layer composed of elements in the form of plates, panels or the like, in particular photovoltaic panels, located at some distance from the lower airtight cover.

This system is characterized in that the elements 1 of the upper layer are carried and held on the cover 2 by a support and attachment device as described above and shown in the accompanying drawings.

Preferably, the airtight cover 2 has, on the surface, a bituminous sealing membrane, optionally forming part of a sealing complex with two superposed layers, and the elements 1 of the upper layer consist of photovoltaic panels.

Finally, the object of this invention is also an inclined support and holding bracket 3 that is designed to be part of a device for support and attachment of elements in the form of plates 1, as described above.

This bracket 3 essentially consists of a hollow body 3' of triangular shape, with a lower portion 4 that is designed to rest on the surface of the cover 2 and to be secured to the latter, and at least one upper portion 4' that is designed to support directly or indirectly one or more elements in the form of plates, panels or the like 1, with this bracket 3 having, seen from the side, a triangular structure whose base is formed by the lower portion 4 and of which the side(s) defining an acute angle with the base is (are) formed by the upper portion(s) 4' ensuring the inclined support and holding.

The bracket 3 can have the shape of an isosceles triangle, triangular rectangle, or else any triangle with upper portions of different slopes.

Preferably, the bracket 3 has a preferred upper support surface corresponding to an acute slope surface relative to the support surface of the lower portion 4.

In accordance with the invention, the lower portion 4 is provided on the underside with at least one connecting portion 5 of plate, panel, membrane or sheet, forming a connected protector that is secured to said lower portion 4, with the connecting portion 5 consisting of a material, or being based on a material that is compatible with and/or of the same nature as the layer or the surface covering of the cover and being linked to this layer or to this covering by an adhesive connection.

The body of the bracket 3 is hollow, and the upper portion 4' comprises one or more wall portions of said hollow body 3' providing one or more elongated support surface(s) 9 for the lateral edges 1' of panels or the like or for a profile member 20 for mounting the latter.

Advantageously, the hollow body 3' consists of two complementary half-shells 3", having symmetrical shapes, and assembled with one another along a median plane at least at peripheral edges 13 in contact with said half-shells 3", and optionally at formations 18 projecting toward the inside and in mutual contact of the two half-shells 3", and in that hooking or anchoring sites 10 for removable means 10' of lateral attachment of panels 1 or the like 4 in the form of metal plates 12 that are elongated and pierced along a central strip 12' are combined with at least some of the elongated support surfaces 9 of the upper portion, whereby these plates 12 comprise lateral wings 12" on both sides of said central strip 12', said wings being embedded in suitable receiving gaps 14 formed in, close to, or under the wall portions 9 forming the upper portion 4', in such a way that said elongated metal plates 12 form inserts rigidly in the hollow body 3' by opposite interlocking in the gaps 14 of two assembled half-shells 3", with the central perforated strip 12' of each plate 12 having hooking or anchoring sites 10, with said strip being visible through an opening formed by cooperation of suitable cutouts 15 of wall portions 9 of the two half-shells 4'.

Preferably, each half-shell 3" comprises, at the upper portion 4', local deformations 19, 19' of the side wall and wall portions forming in the elongated support surfaces 9, which define by cooperation the receiving gaps 14 for the lateral wings 12" of the plates 12.

Of course, the invention is not limited to the embodiments described and shown in the accompanying drawings. Modifications remain possible, in particular from the standpoint of the composition of the various elements or by substitution of equivalent techniques, without thereby exceeding the field of protection of the invention.

The invention claimed is:

1. A device for support and attachment of plural panel elements (1) on a building roof, the device comprising:
   plural inclined support and holding brackets (3) for the plural panel elements (1), each of the plural brackets (3) having a lower portion (4) adapted to rest on a surface of the roof and to be secured to the roof, and at least one upper portion (4') adapted to support one or more of the plural panel elements (1), at least one of the plural brackets (3) having in cross-section, a triangular structure with a base formed by the lower portion and a side formed by the at least one upper portion, the side defining with the base an acute angle,
   each of said plural brackets comprising a hollow body, the lower portion (4) of at least one of said plural brackets (3) being provided with at least one connecting portion (5) that is secured to the at least one of said plural brackets (3), wherein the at least one connecting portion is adapted to be connected to the surface of the roof by an adhesive connection,
   wherein said plural brackets (3) are arranged according to at least one alignment and are mutually spaced apart,
   wherein the upper portions (4') of the plural brackets (3) comprise one or more portions of a wall of said hollow body (3') providing one or more elongated support surfaces (9) for lateral side edges (1') of the plural panel elements, each of the plural panel elements is supported only at two of said lateral side edges that are opposite each other by two of the plural brackets (3), thus allowing cooling of the plural panel elements (1) by circulation of air underneath said plural panel elements, and
   wherein the lower portion (4) of each of said plural brackets (3) has at least one lateral flat formation (6, 6') providing an external support area and that is adapted to attach to the at least one connecting portion (5), the at least one lateral flat formation being provided with openings (6") for accommodating mechanical attachment elements (7) that pass through the at least one connecting portion and that press the at least one connecting portion against said lateral formation (6, 6').

2. The device according to claim 1, wherein the lower portion (4) of each of the plural brackets (3) has an external surface support area at least at each of opposite longitudinal ends thereof, and wherein the connecting portion (5) has a surface extension that is respectively larger than the external surface support area.

3. The device according to claim 1, wherein the adhesive connection is a connection by gluing with a gluing agent.

4. The device according to claim 1, wherein the adhesive connection is a weld.

5. The device according to claim 1, wherein the adhesive connection extends over an entire bottom surface of said at least one connecting portion.

6. The device according to claim 1, wherein the hollow body of each of said plural brackets (3) comprises a polymer material.

7. The device according to claim 6, wherein the polymer material is selected from the group consisting of high-density polyethylene (HDPE), polycarbonate, an ABS/PMMA mixture, and polypropylene, and wherein the hollow body comprises hollow and projecting reinforcement formations (18, 18') at side walls.

8. The device according to claim 1, wherein each of said plural brackets (3) comprises plural hooking or anchoring sites (10) for removable engagement of said panel elements.

9. The device according to claim 1, wherein the upper portion (4') of the hollow body (3') comprises multiple elongated support surfaces (9), separated from one another by one or more through transverse cavities (16) that are deformations of a wall of the hollow body (3') and that are each adapted to be a support bearing for an elongated element (17).

10. The device according to claim 1, wherein the hollow body has a tapered shape from the upper portion (4') to the lower portion (4), thus having a truncated shape in cross-section.

11. The device according to claim 1, wherein the lower portion (4) has an open structure on the underside and wherein the hollow body (3') comprises, in addition to the at least one lateral flat formation (6, 6') providing an external support area, at least one interior lateral formation (22) providing a support area at a lower edge of an interior side of the walls of said hollow body (3').

12. A device for support and attachment of plural panel elements (1) on a building roof, the device comprising:
   plural inclined support and holding brackets (3) for the plural panel elements (1), each of the plural brackets (3) having a lower portion (4) adapted to rest on a surface of the roof and to be secured to the roof, and at least one upper portion (4') adapted to support one or more of the plural panel elements (1), at least one of the plural brackets (3) having, seen from a side, a triangular structure whose base is formed by the lower portion and whose side is formed by the at least one upper portion, the side defining with the base an acute angle,
   each of said plural brackets comprising a hollow body, the lower portion (4) of at least one of said plural brackets (3) being provided with at least one connecting portion (5) that is secured to the at least one of said plural brackets (3), wherein the at least one connecting portion is adapted to be connected to the surface of the roof by an adhesive connection,
   wherein said plural brackets (3) are arranged according to at least one alignment and are mutually spaced apart,
   wherein the upper portions (4') of the plural brackets (3) comprise one or more portions of wall of said hollow body (3') providing one or more elongated support surfaces (9) for lateral side edges (1') of the plural panel elements, each of the plural panel elements is supported only at two of said lateral side edges that are opposite each other by two of the plural brackets (3), thus allowing cooling of the plural panel elements (1) by circulation of air underneath said plural panel elements,
   wherein each of said plural brackets (3) comprises plural hooking or anchoring sites (10) for removable engagement of said plural panel elements, the plural hooking or anchoring sites being distributed along the one or more elongated support surfaces (9), and
   wherein each of said one or more elongated support surfaces (9) is subdivided by stop means (11) into two elementary surfaces (9'), each being adapted to support at least a portion of a respective said lateral side edge (1'), and wherein the plural hooking or anchoring sites

(10) are perforations in one or more metal plates (12) that are integrated into the hollow body.

13. A device for support and attachment of plural panel elements (1) on a building roof, the device comprising:

plural inclined support and holding brackets (3) for the plural panel elements (1), each of the plural brackets (3) having a lower portion (4) adapted to rest on a surface of the roof and to be secured to the roof, and at least one upper portion (4') adapted to support one or more of the plural panel elements (1), at least one of the plural brackets (3) having, seen from a side, a triangular structure whose base is formed by the lower portion and whose side is form by the at least one upper portion, the side defining with the base an acute angle, each of said plural brackets comprising a hollow body, the lower portion (4) of at least one of said brackets (3) being provided with at least one connecting portion (5) that is secured to the at least one of said plural brackets (3), wherein the at least one connecting portion is adapted to be connected to the surface of the roof by an adhesive connection, wherein said plural brackets (3) are arranged according to at least one alignment and are mutually spaced apart, wherein the upper portions (4') of the plural brackets (3) comprise one or more portions of wall of said hollow body (3') providing one or more elongated support surfaces (9) for lateral side edges (1') of the plural panel elements, each of the plural panel elements is supported only at two of said lateral side edges that are opposite each other by two of the plural brackets (3), thus allowing cooling of the plural panel elements (1) by circulation of air underneath said plural panel elements, and wherein the hollow body (3') comprises two complementary half-shells (3") having symmetrical shapes, and assembled to one another along a median plane at least at peripheral edges (13) of said half-shells (3").

14. The device according to claim 13, wherein each of said plural brackets (3) comprises plural hooking or anchoring sites (10) for removable engagement of said panel elements, wherein the plural hooking or anchoring sites (10) comprise metal plates (12) that are elongated and transverse to a central strip (12'), and wherein the plates (12), on both sides of said central strip (12'), comprise lateral wings (12") that are adapted to be embedded in receiving gaps (14) that are formed in, close to, or under the wall portions (9) forming the upper portion (4') in such a way that said elongated metal plates (12) are held rigidly in the hollow body (3') by opposite interlocking after assembly of the two half-shells (3"), the central strip (12') comprising the hooking or anchoring sites (10).

15. The device according to claim 14, wherein each of said half-shells (3") comprises, at the upper portion (4') of the respective one of said brackets, deformations (19, 19') of the side wall and wall portions forming the elongated support surfaces (9), which define the receiving gaps (14) for the lateral wings (12") of the plates (12).

* * * * *